United States Patent
Vandergrift

(10) Patent No.: US 8,929,044 B2
(45) Date of Patent: Jan. 6, 2015

(54) SYSTEM AND METHOD FOR CONTROLLED OVERVOLTAGE DETECTION

(75) Inventor: Adrian E. Vandergrift, Rockton, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 311 days.

(21) Appl. No.: 13/495,457

(22) Filed: Jun. 13, 2012

(65) Prior Publication Data

US 2013/0335872 A1 Dec. 19, 2013

(51) Int. Cl.
*G01R 17/02* (2006.01)

(52) U.S. Cl.
USPC .......................................... 361/93.1; 361/93.2

(58) Field of Classification Search
CPC ...... G01R 17/02; G01R 19/165; G01R 19/04; G01R 19/30
USPC ................................................ 361/93.1, 93.2
See application file for complete search history.

(56) References Cited

U.S. PATENT DOCUMENTS

| | | | | |
|---|---|---|---|---|
| 3,480,834 A * | 11/1969 | Billings | ........................ | 361/91.3 |
| 5,073,724 A * | 12/1991 | Fox | .................... | 327/74 |
| 5,276,434 A * | 1/1994 | Brooks et al. | ................. | 340/632 |
| 7,443,111 B2 * | 10/2008 | Jang et al. | ..................... | 315/291 |
| 8,232,778 B1 * | 7/2012 | Patel | ............................... | 322/37 |
| 2003/0197478 A1 * | 10/2003 | Kito | .............................. | 315/291 |

OTHER PUBLICATIONS

Time Constant, article from online encyclopedia, wikipedia http://an.wikipedia.org/wiki/Time_constant, pp. 1-10, Jun. 19, 2014.*

\* cited by examiner

*Primary Examiner* — Zeev V Kitov
(74) *Attorney, Agent, or Firm* — Kinney & Lange, P.A.

(57) ABSTRACT

An overvoltage detection system includes a sensed voltage; an active reference module that generates an active reference signal having a magnitude that varies inversely with a magnitude of the sensed voltage; and a timed trip module that includes a resistor and capacitor, and detects an overvoltage condition as a function of the sensed voltage, the active reference signal, and time.

10 Claims, 4 Drawing Sheets

SYSTEM AND METHOD FOR CONTROLLED OVERVOLTAGE DETECTION

BACKGROUND

The present invention relates to overvoltage detection, and in particular to a system and method for controlled overvoltage detection.

Electric power systems, such as those on an aircraft, are susceptible to overvoltage conditions. An overvoltage condition exists when the voltage applied to a load, for example, is larger than a voltage the load is rated to handle. These conditions may occur, for example, due to a lightning strike. If the voltage is large enough, or exists for long enough, permanent damage can be incurred by the system. Therefore, it is necessary to detect overvoltage conditions so that they may be handled prior to damaging the circuit.

Aside from unpredictable occurrences such as lighting strikes, overvoltage conditions may occur due to predictable events such as removing or adding power to a load. These events can create transients within the power system that do not pose a threat to the system if their duration is short. These transients have a natural recovery time, and it is desirable to not indicate an overvoltage condition if the system recovers within this natural recovery time. Therefore, timed trip overvoltage detection has been implemented to accommodate these expected short transients.

Timed trip overvoltage detection has been accomplished in the past using a simple resistor-capacitor (RC) circuit. A sensed voltage is input to the RC circuit, and the voltage across the capacitor is compared to a reference voltage. This reference voltage is generally set to a voltage that will cause an overvoltage indication at $5\tau$, where $\tau=R*C$ (i.e., when the capacitor is fully charged). Therefore, the higher the sensed voltage, the faster the capacitor will reach that trip threshold. This creates a "trip curve" where the necessary voltage to indicate an overvoltage fault decreases with time. The rate of change of the trip curve is equal to the rate of change of the voltage across the resistor of the RC circuit, which is approximately $1/e^{(t/\tau)}$. Because of this, using solely an RC circuit greatly limits control of the characteristics of the timed trip curve.

SUMMARY

An overvoltage detection system includes a sensed voltage, an active reference module, and a timed trip module. The active reference module generates an active reference signal that has a magnitude that varies inversely with a magnitude of the sensed voltage. The timed trip module includes a resistor and a capacitor, and detects an overvoltage condition as a function of the sensed voltage, the active reference signal, and time.

DETAILED DESCRIPTION

The present invention describes a system and method for controlled overvoltage detection. The system includes an active reference circuit and an overvoltage timed trip circuit. The active reference circuit receives a sensed voltage and provides an output having a magnitude that varies inversely with a magnitude of the sensed voltage. The output of the active reference circuit is provided as input to the timed trip circuit. Because the active reference varies inversely with the sensed voltage, the overvoltage timed trip curve can be flattened below a traditional resistor-capacitor (RC) inverse time curve.

Figure 1:
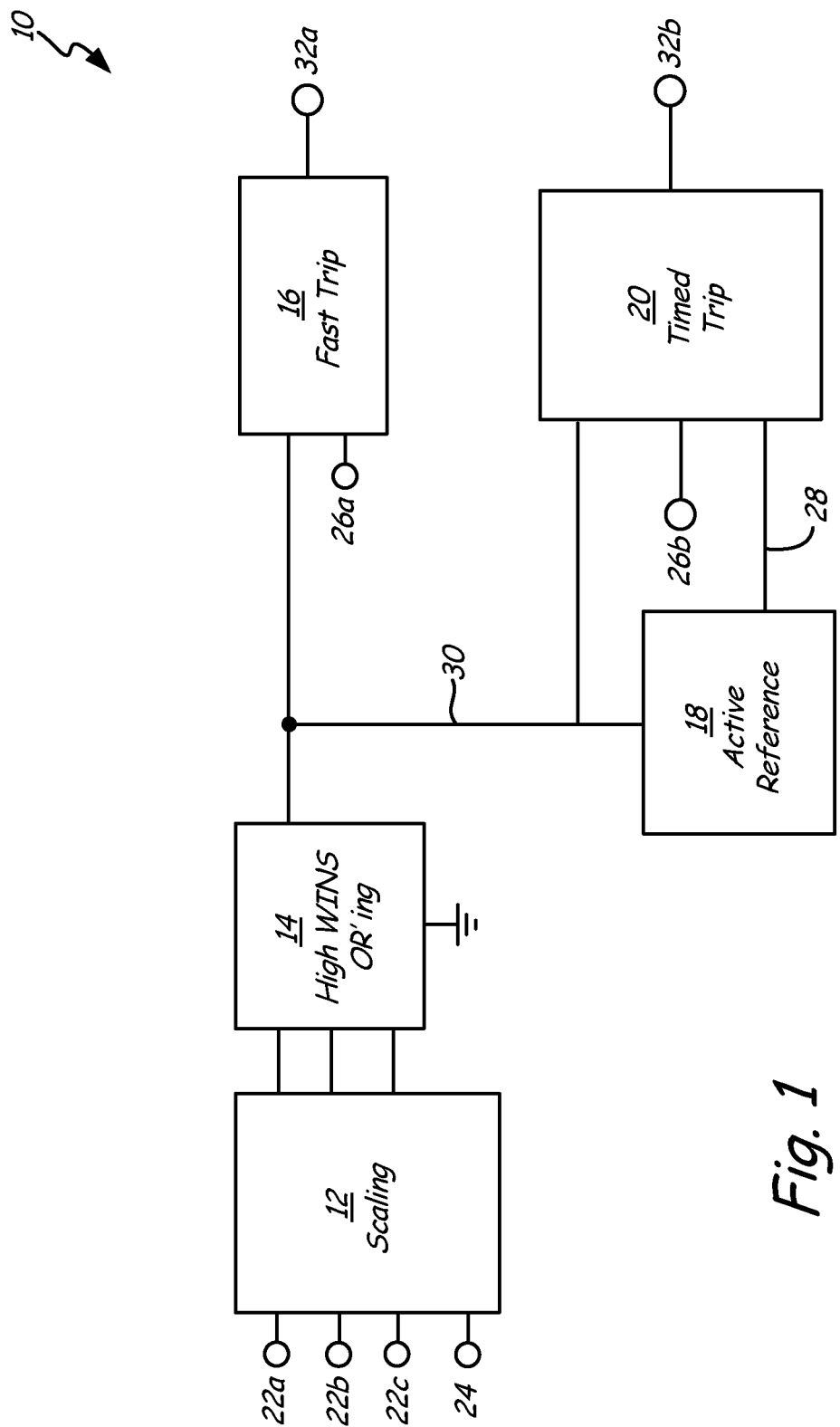
FIG. 1 is a block diagram illustrating an overvoltage detection system according to an embodiment of the present invention.

FIG. 1 is a block diagram illustrating a system 10 for detecting an overvoltage condition. System 10 comprises a scaling module 12, a high-wins OR'ing module 14, an overvoltage fast trip module 16, an active reference module 18, and an overvoltage timed trip module 20, phase inputs 22a-22c, neutral input 24, overvoltage reference inputs 26a-26b, overvoltage reference line 28, sensed voltage line 30, and overvoltage outputs 32a-32b. Although illustrated as having three alternating current (AC) phase inputs 22a-22c, system 10 can be implemented with any number of phase inputs, both AC and direct current (DC). Scaling module 12 scales down phase inputs 22a-22c by any desired factor, such as 100. High-wins OR'ing module 14 converts the phase signals from AC to DC and selects the phase with the highest voltage using, for example, diode OR'ing. The output of high-wins OR'ing module 14 is a sensed DC voltage provided on sensed voltage line 30.

If the DC voltage on sensed voltage line 30 is large enough, system 10 will immediately indicate an overvoltage condition on overvoltage output 32a. Overvoltage fast trip module 16 indicates an overvoltage condition if the voltage on sensed voltage line 30 is larger than the voltage on overvoltage reference input 26a. The voltage on reference input 26a is defined by the system and can be any value for which an overvoltage condition should immediately be flagged. Overvoltage fast trip module 16 is implemented, for example, using a comparator.

Active reference module 18 and timed trip module 20 act together to provide a time dependent overvoltage indication on overvoltage output 32b. Active reference module 18 receives input on sensed voltage line 30. Active reference module 18 provides output on overvoltage reference line 28 that is inversely proportional to the voltage on sensed voltage line 30. This output is provided to timed trip module 20 to be used as an active reference voltage. Timed trip module 20 is implemented using a resistor-capacitor (RC) circuit. The capacitor begins charging when the voltage on sensed voltage line 30 is larger than the voltage on overvoltage reference input 26b. The voltage across the capacitor is compared to the voltage on overvoltage reference line 28 in order to determine if an overvoltage condition is present.

Figure 2:
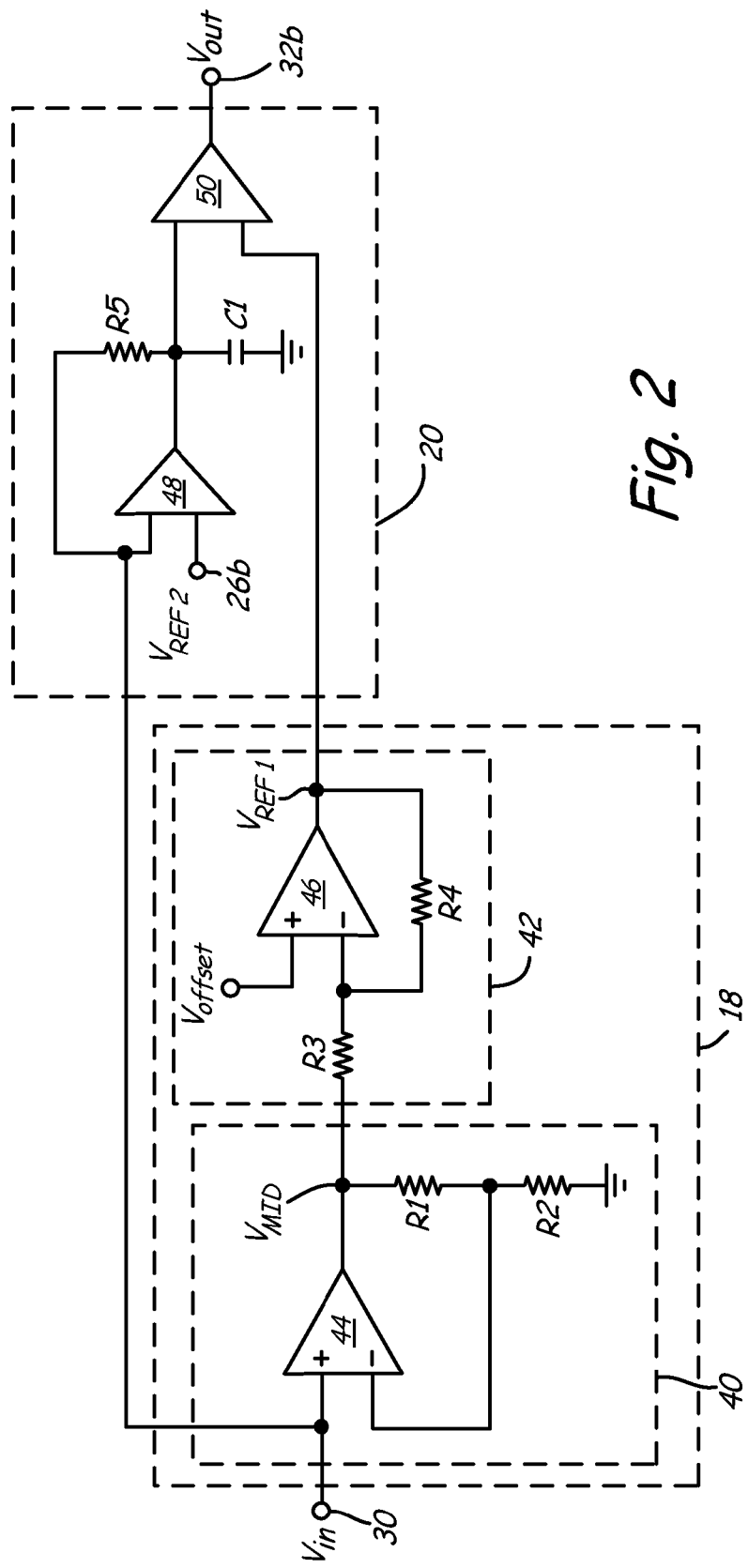
FIG. 2 is a circuit diagram illustrating an active reference module and an overvoltage timed trip module according to an embodiment of the present invention.

FIG. 2 is a circuit diagram illustrating an active reference module 18 and timed trip module 20 according to an embodiment of the present invention. Active reference module 18 is a circuit that includes non-inverting amplifier circuit 40, and inverting amplifier circuit 42. Non-inverting amplifier circuit 40 includes operational amplifier 44, resistors R1 and R2, and receives input on sensed voltage line 30 ($V_{IN}$). Inverting amplifier circuit 42 includes operational amplifier 46 and resistors R3 and R4. Timed trip module 20 is a circuit that includes capacitor C1, resistor R5, comparators 48 and 50, receives input on overvoltage reference input 26b ($V_{REF2}$), and provides output on overvoltage output 32b ($V_{OUT}$).

Non-inverting amplifier circuit 42 receives input voltage $V_{IN}$. This input voltage is a sensed voltage and is provided to the non-inverting input of operational amplifier 44. The inverting input of operational amplifier 44 is connected to ground. Therefore, the output voltage of non-inverting amplifier circuit 42 is $V_{MID}=V_{IN}*(1+R1/R2)$. This output is provided to inverting amplifier circuit 42. Resistor R3 is connected between $V_{MID}$ and the inverting input of operational amplifier 46. Resistor R4 is connected between the inverting input of operational amplifier 46 and the output of inverting amplifier 42, $V_{REF1}$. The non-inverting input of operational amplifier 46 is connected to a voltage $V_{OFFSET}$ which is defined by the system. Thus, the transfer function for active reference circuit 18 is: $V_{REF1}=V_{OFFSET}*(1+R4/R3)-(R4/R3)*(V_{IN}*(1+R1/R2))$. Therefore, as $V_{IN}$ increases, $V_{REF1}$ decreases at a rate dependent upon selected values of $V_{OFFSET}$, and R1-R4.

Timed trip circuit 20 provides output $V_{OUT}$ that indicates an overvoltage fault. The sensed voltage, $V_{IN}$, is provided as input to comparator 48 along with an overvoltage reference $V_{REF2}$. Resistor R5 is connected between $V_{IN}$ and the output of comparator 48. Capacitor C1 is connected between the output of comparator 48 and ground. The voltage across the capacitor is input into comparator 50 along with $V_{REF1}$. When $V_{IN}$ is greater than $V_{REF2}$, capacitor C1 begins to charge. When $V_{IN}$ is less than $V_{REF2}$, capacitor C1 discharges. If the voltage across capacitor C1 is ever larger than $V_{REF1}$, an overvoltage fault is indicated by the output of comparator 50. Therefore, if the voltage at $V_{IN}$ is greater than $V_{REF2}$ for a long enough time period, an overvoltage fault will be indicated. Because of active reference module 18, the larger $V_{IN}$ is, the lower the voltage across capacitor C1 needs to be in order to detect an overvoltage fault.

Figure 3:
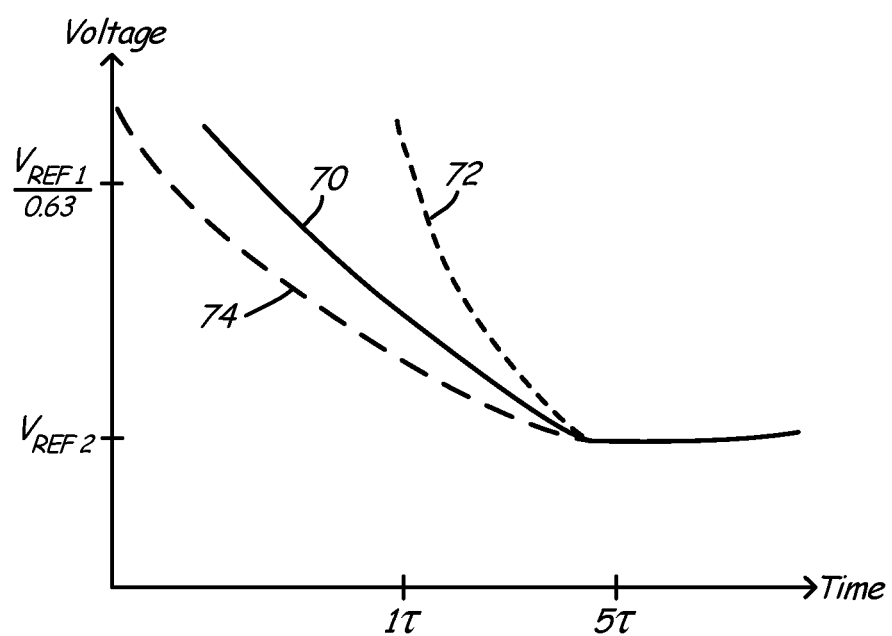
FIG. 3 is a chart illustrating an inverse time curve according to an embodiment of the present invention.

FIG. 3 is a chart illustrating an overvoltage trip curve 70 according to an embodiment of the present invention. Trip curve 70 represents a voltage $V_{IN}$ required to indicate an overvoltage condition over time for system 10. Dashed line 72 illustrates a value of voltage over time of $V_{IN}$ for which an overvoltage will be detected if active reference module 18 were removed and $V_{REF1}$ simply equaled $V_{REF2}$. This time curve is an RC time curve that decreases at a rate of approximately $1/e^{(t/\tau)}$, where $\tau=R5*C1$. At $t=5\tau$, the capacitor is essentially fully charged. The primary advantage of adding active reference module 18 is shown in the difference between dashed line 72 and trip curve 70. By providing an active reference that varies inversely with the sensed voltage, the rate at which trip curve decreases over time can essentially be 'flattened,' lowering it below the standard RC rate of $1/e^{(t/\tau)}$, allowing greater customizability of the system. For example, the voltage $V_{IN}$ required at $1\tau$ for a simple RC system is approximately $V_{REF2}/0.63$. This value can be decreased, as illustrated, using active reference module 18 while keeping the same trip value, $V_{REF2}$, at $5\tau$. Dashed line 74 illustrates a further possible trip curve that could be obtained by adjusting the values of R1-R4 and $V_{OFFSET}$.

Figure 4:
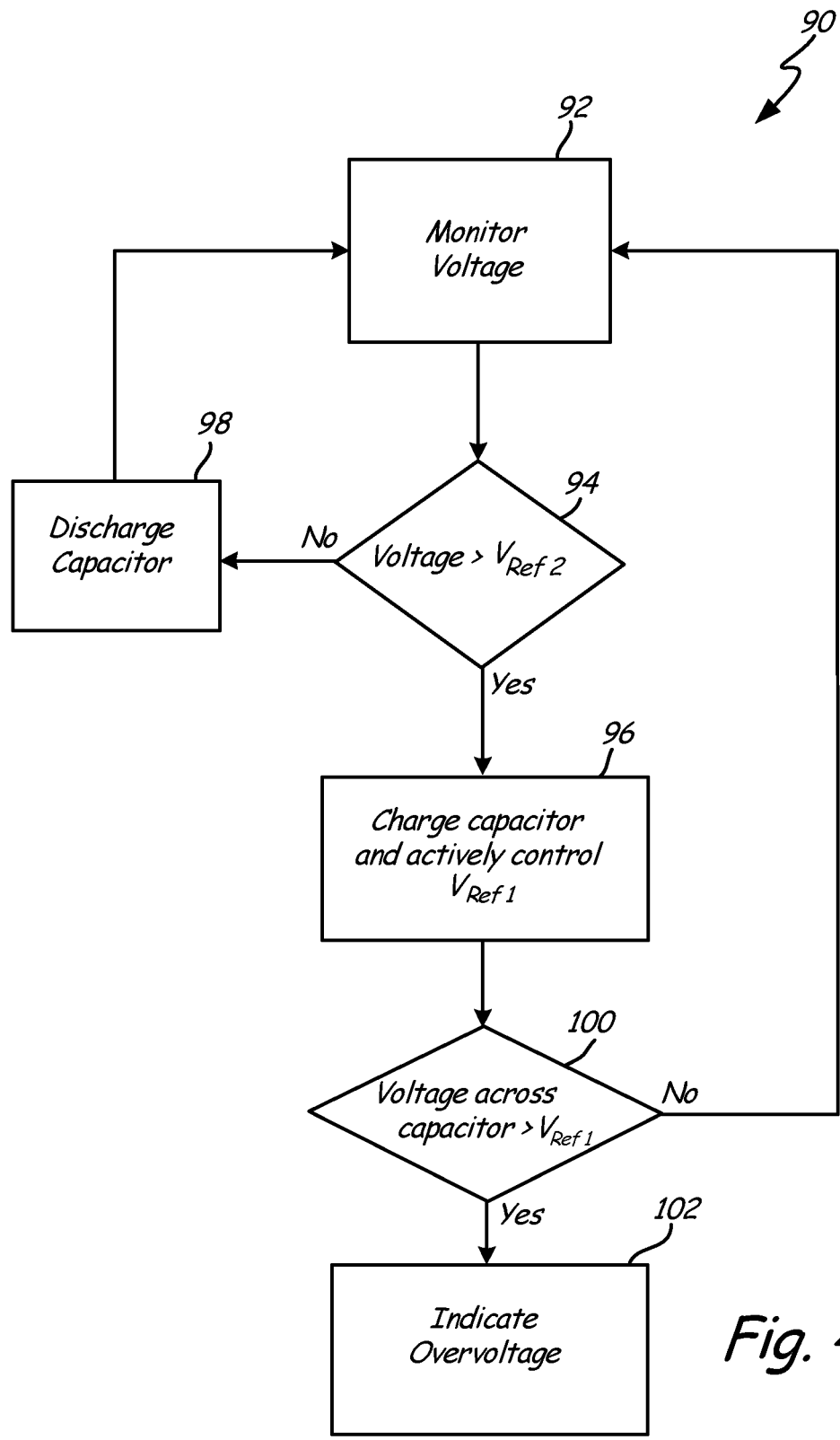
FIG. 4 is a flowchart illustrating a method of detecting an overvoltage condition according to an embodiment of the present invention.

FIG. 4 is a flowchart illustrating a method 90 of detecting an overvoltage according to an embodiment of the present invention. At step 92, a voltage is sensed by system 10. This voltage is provided to active reference module 18. At step 92, active reference module 18 provides a reference voltage that is inversely proportional to the sensed voltage. At step 94, it is determined if the voltage sensed by the system is greater than a fixed reference voltage. If it is, method 90 proceeds to step 96 and charges capacitor C1. If it is not, method 90 proceeds to step 98 and discharges the capacitor. Following step 98, method 90 returns to step 92. At step 100, it is determined if the voltage across capacitor C1 is greater than the active reference voltage. If it is, method 90 proceeds to step 102 and indicates an overvoltage fault. If it is not, method 90 returns to step 92.

In this way, the present invention describes a controlled overvoltage detection system. Although the present invention has been described with reference to preferred embodiments, workers skilled in the art will recognize that changes may be made in form and detail without departing from the spirit and scope of the invention.

The invention claimed is:

1. An overvoltage detection system comprising:
   a sensed voltage;
   an active reference module that generates an active reference signal having a magnitude that varies inversely with a magnitude of the sensed voltage, wherein the active reference module comprises:
   a non-inverting amplifier comprising a first operational amplifier and first and second resistors, wherein the non-inverting amplifier receives the sensed voltage as input; and
   an inverting amplifier comprising a second operational amplifier and third and fourth resistors, wherein the inverting amplifier receives an output of the non-inverting amplifier as input, and wherein the active reference signal is an output of the second operational amplifier; and
   a timed trip module that includes a reference resistor and a capacitor, wherein the timed trip module detects an overvoltage condition as a function of the sensed voltage, the active reference signal, and time.

2. The system of claim 1, wherein the timed trip module comprises:
   a first comparator, wherein when the sensed voltage is larger than a fixed reference voltage, the capacitor begins to charge; and
   a second comparator, wherein when a voltage across the capacitor is larger than the active reference signal, the output of the comparator indicates an overvoltage fault.

3. The system of claim 1, further comprising:
   a scaling module for scaling down a three-phase AC input voltage; and
   a high WINS OR'ing module configured to select a highest amplitude phase of the scaled three-phase AC input as the sensed voltage.

4. The system of claim 3, further comprising a fast trip module for immediately detecting an overvoltage fault if the sensed voltage is greater than a fast trip reference voltage.

5. A method of detecting an overvoltage, the method comprising:
   monitoring a voltage;
   inputting the monitored voltage into a non-inverting input of a non-inverting amplifier, wherein the non-inverting amplifier comprises a first operational amplifier and first and second resistors;
   inputting an output of the first operational amplifier into an inverting input of an inverting amplifier, wherein the inverting amplifier comprises a second operational amplifier and third and fourth resistors;
   charging a capacitor if the monitored voltage is larger than a fixed reference voltage; and
   indicating an overvoltage fault if a voltage across the capacitor is larger than an output of the second operational amplifier.

6. The method of claim 5, wherein charging a capacitor if the monitored voltage is larger than a fixed reference voltage comprises:
- comparing the monitored voltage with the fixed reference voltage;
- charging the capacitor using the monitored voltage if the monitored voltage is greater than the fixed reference voltage; and
- discharging the capacitor if the monitored voltage is less than the fixed reference voltage.

7. The method of claim 5, wherein monitoring a voltage comprises:
- scaling down a three-phase voltage by a predetermined factor; and
- providing a phase with the greatest amplitude of the scaled three-phase voltage as the monitored voltage.

8. An overvoltage detection circuit comprising:
- an active reference circuit that generates an active reference voltage having a magnitude that varies inversely with a magnitude of a monitored voltage, wherein the active reference circuit comprises:
  - a non-inverting amplifier circuit comprising a first operational amplifier and first and second reference resistors, wherein the non-inverting amplifier receives the sensed voltage as input; and
  - an inverting amplifier circuit comprising a second operational amplifier and third and fourth reference resistors, wherein the inverting amplifier receives an output of the non-inverting amplifier as input, and wherein the active reference signal is an output of the second operational amplifier; and
- a timed trip circuit that includes a reference resistor and a reference capacitor, wherein the timed trip circuit detects an overvoltage condition as a function of the monitored voltage, the active reference voltage, and time.

9. The circuit of claim 8, wherein a voltage required for the timed trip circuit to detect an overvoltage condition decreases at a rate less than $1/e^{(t/\tau)}$ between $t=1\tau$ and $t=5\tau$ seconds from when the reference capacitor begins to charge, wherein t is equal to time and r is equal to a resistance of the reference resistor multiplied by a capacitance of the reference capacitor.

10. The circuit of claim 8, wherein the transfer function of the active reference circuit is:

$$V_{REF}=V_{OFFSET}*(1+R4/R3)-(R4/R3)*(V_{IN}*(1+R1/R2))$$ wherein:

$V_{REF}$=the active reference signal;
$V_{OFFSET}$=the offset voltage;
R1=the first reference resistor of the non-inverting amplifier;
R2=the second reference resistor of the non-inverting amplifier;
R3=the third reference resistor of the inverting amplifier;
R4=the fourth reference resistor of the inverting amplifier; and
$V_{IN}$=the sensed voltage.

* * * * *